(12) United States Patent
Iwaki et al.

(10) Patent No.: US 9,174,315 B2
(45) Date of Patent: Nov. 3, 2015

(54) COMPONENT MOUNTING METHOD AND COMPONENT MOUNTING APPARATUS

(75) Inventors: Noriaki Iwaki, Chiryu (JP); Tsuyoshi Hamane, Chiryu (JP)

(73) Assignee: FUJI MACHINE MFG. CO., LTD., Chiryu-shi (JP)

( * ) Notice: Subject to any disclaimer, the term of this patent is extended or adjusted under 35 U.S.C. 154(b) by 212 days.

(21) Appl. No.: 13/978,802

(22) PCT Filed: Jan. 30, 2012

(86) PCT No.: PCT/JP2012/052001
§ 371 (c)(1),
(2), (4) Date: Jul. 9, 2013

(87) PCT Pub. No.: WO2012/117790
PCT Pub. Date: Sep. 7, 2012

(65) Prior Publication Data
US 2013/0283594 A1    Oct. 31, 2013

(30) Foreign Application Priority Data
Feb. 28, 2011    (JP) .................................. 2011-041207

(51) Int. Cl.
*B23P 11/00* (2006.01)
*H05K 13/00* (2006.01)
*H05K 13/04* (2006.01)

(52) U.S. Cl.
CPC ............ *B23P 11/00* (2013.01); *H05K 13/0061* (2013.01); *H05K 13/0413* (2013.01);
(Continued)

(58) Field of Classification Search
CPC ............... B23P 11/00; H05K 13/0413; H05K 13/0061; Y10T 29/49826; Y10T 29/53687; Y10T 29/53174; Y10T 29/53191; Y10T 29/4998; Y10T 29/49769; Y10T 29/4978
See application file for complete search history.

(56) References Cited

U.S. PATENT DOCUMENTS 5,093,984 A * 3/1992 Lape ................................ 29/741
5,894,657 A * 4/1999 Kanayama et al. ............. 29/740

FOREIGN PATENT DOCUMENTS

| CN | 101098619 A | 1/2008 |
| JP | 5 198993 | 8/1993 |

(Continued)

OTHER PUBLICATIONS

International Search Report issued Mar. 13, 2012 in PCT/JP12/052001 Filed Jan. 30, 2012.

(Continued)

*Primary Examiner* — John C Hong
(74) *Attorney, Agent, or Firm* — Oblon, McClelland, Maier & Neustadt, L.L.P.

(57) ABSTRACT

In a component mounting method and apparatus capable of mounting components on a board having a non-planar component mounting surface, a board holding table in a board holding device is turned based on board holding device information and board information to direct a normal line to a mounting portion on the non-planar component mounting surface in the vertical direction. Thus, after being picked up and moved by a component loading device onto the normal line to the mounting portion, a component can be mounted through a movement of the component loading device in the vertical direction only. Further, compensation amounts for the position of the mounting portion are calculated based on a turn amount, the board holding device information and the board information, and a compensated mounting position is calculated from the compensation amounts and the board information accurately in the horizontal and vertical directions.

8 Claims, 11 Drawing Sheets

(52) U.S. Cl.
CPC .......... *Y10T29/4978* (2015.01); *Y10T 29/4998* (2015.01); *Y10T 29/49769* (2015.01); *Y10T 29/49826* (2015.01); *Y10T 29/53174* (2015.01); *Y10T 29/53191* (2015.01); *Y10T 29/53687* (2015.01)

(56) References Cited

FOREIGN PATENT DOCUMENTS

| | | |
|---|---|---|
| JP | 11 154798 | 6/1999 |
| JP | 2000 277991 | 10/2000 |
| JP | 2000 307296 | 11/2000 |
| JP | 2002-119781 A | 4/2002 |
| JP | 2005 66760 | 3/2005 |
| JP | 2006 24619 | 1/2006 |
| JP | 2007 214227 | 8/2007 |
| JP | 2009 27015 | 2/2009 |
| JP | 2009-70922 A | 4/2009 |
| JP | 2012-84701 A | 4/2012 |

OTHER PUBLICATIONS

Japanese Office Action issued on Dec. 2, 2014 in Patent Application No. 2011-041207.
Office Action issued Jun. 1, 2015 in Chinese Patent Application No. 201280010049.4 (with English translation).

* cited by examiner

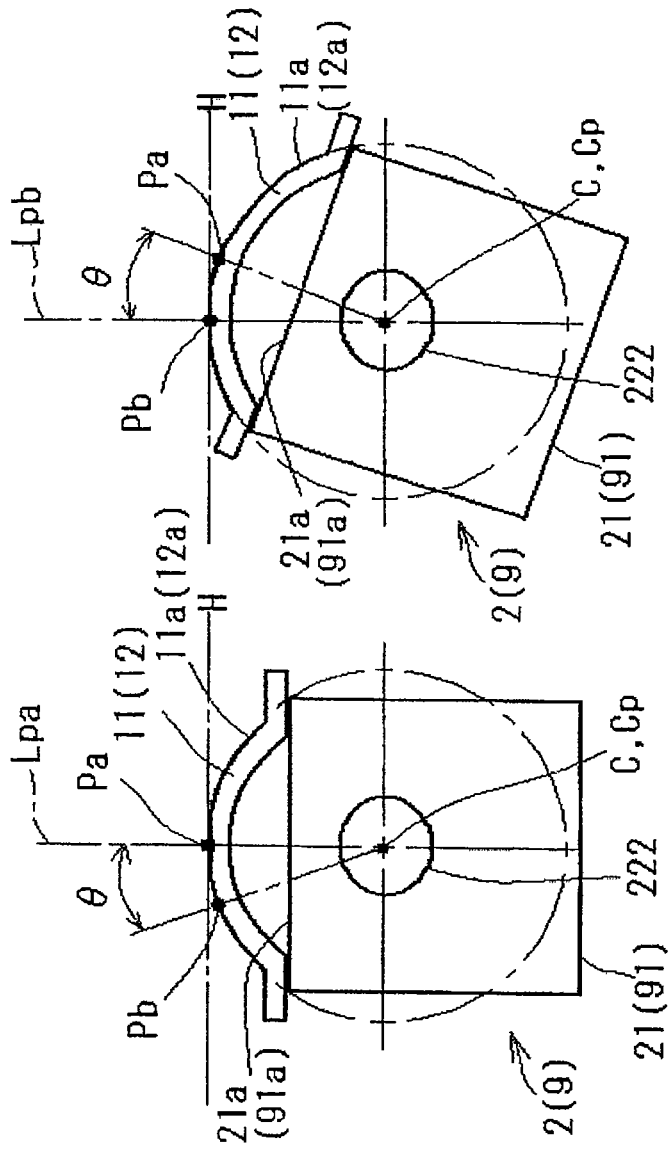

COMPONENT MOUNTING METHOD AND COMPONENT MOUNTING APPARATUS

TECHNICAL FIELD

The present invention relates to a component mounting method and a component mounting apparatus for mounting components on a board having a non-planar component mounting surface.

BACKGROUND ART

As boards having a non-planar component mounting surface, there are cited, for example, a board having a curved-shape component mounting surface that is constituted by a part of a columnar shape, a part of a spherical shape or the like, a board having component mounting surfaces of plural surfaces that are inclined at a plurality of angles like a pyramid shape, and the like. For example, Patent Document 1 discloses a component mounting method in which a component is attracted to an extreme end of an attraction head (component attraction nozzle) and is mounted on an inclined mounting-section wall surface (component mounting surface) of a three-dimensional board (board having a non-planar component mounting surface). The attraction head is configured movably in the horizontal direction and the vertical direction and to be turnable about an axis extending in the vertical direction. Further, the extreme end portion of the attraction head is configured to be turnable about an axis extending in the horizontal direction, that is, to be bendable relative to the axis extending in the vertical direction. In the component mounting method, a component is attracted to the extreme end of the attraction head, and the attraction head is bent at the extreme end portion thereof in dependence on the inclination angle of the mounting-section wall surface of the three-dimensional board and is moved to mount the component on the mounting-section wall surface of the three-dimensional board.

PRIOR ART DOCUMENT

Patent Document

Patent Document 1: JP11-154798 A (paragraph 0009 and FIG. 4)

SUMMARY OF THE INVENTION

Problem to be Solved by the Invention

In the component mounting method described in Patent Document 1, when the component is mounted on the inclined mounting-section wall surface of the three-dimensional board, the attraction head has to be moved in a bend direction, that is, in a direction normal to the mounting-section wall surface, and thus, there is required a complicated operation control. On the other hand, when a component mounting is performed by moving the attraction head in the vertical direction with the head bent, there is only required a simple operation control. However, there arises an anxiety that positional deviations take place when a component is mounted on the inclined mounting-section wall surface of the three-dimensional board.

Further, the component attraction nozzle is reciprocatively moved between a component supply device and the board by the number of times corresponding to the number of components to be mounted, to perform component mountings. In the case of a board being a planar shape, all of mounting portions are set to become a fixed mounting reference height. Thus, the moving stroke in the vertical direction of the component attraction nozzle can be made to be the minimum necessary, so that it is possible to shorten the component mounting time. However, in the case of boards having a non-planar component mounting surface, all of the mounting portions do not become a fixed mounting reference height. Therefore, it may be the case that the moving stroke in the vertical direction of the attraction head becomes longer, and the component mounting time tends to become longer.

The present invention has been made taking the foregoing circumstances into consideration, and an object thereof is to provide a component mounting method and a component mounting apparatus capable of mounting a component on a board having a non-planar component mounting surface through a simple component mounting operation control accurately and in a short period of time.

Solution to the Problems

In order to solve the foregoing problems, the invention according to a first aspect resides in a component mounting method in a component mounting apparatus which comprises a board holding device having a holding member that, in order to mount a component on a board having a non-planar component mounting surface, holds the board at a holding position on a board holding surface and turns the board; a board transfer device that loads and unloads the board with respect to the board holding surface of the holding member; a component supply device that supplies the component to be mounted on the board; and a component loading device that picks up the component from the component supply device and moves the component in two orthogonal directions within a horizontal plane and in a vertical direction to mount the component at a mounting portion on the board held at the holding position on the board holding surface; wherein the component mounting method comprises a board information inputting step of inputting board information relating to the position of a positioned portion for positioning the board on the board holding surface and the position of the mounting portion; a board loading and holding step of loading the board to the holding position on the board holding surface by the board transfer device and of holding the loaded board at the holding position on the board holding surface by holding means provided in the board holding device; a board turning step of turning the holding member of the board holding device so that a normal line to the mounting portion on the non-planar component mounting surface is directed in the vertical direction, based on board holding device information stored in advance that relates to the position in the board holding device of a turn shaft for the holding member, a positional relation between the turn shaft and the board holding surface and the position of the holding position on the board holding surface, and the inputted board information; a compensated mounting position calculating step of calculating compensation amounts in the two orthogonal directions within the horizontal plane and the vertical direction for the position of the mounting portion whose normal line is directed in the vertical direction at the board turning step, based on a turn amount of the holding member at the board turning step, the board holding device information and the board information and of calculating a compensated mounting position from the compensation amounts in the two orthogonal directions within the horizontal plane and in the vertical direction and the board information; and a component mounting step of mounting the component at the mounting portion on the board based on the compensated mounting position.

The invention according to a second aspect resides in that in the first aspect, the board holding device is constructed movably in the vertical direction and that the component mounting step includes compensatingly moving the board holding device in the vertical direction with respect to the compensation amount in the vertical direction calculated at the compensated mounting position calculating step.

The invention according to a third aspect resides in that in the first or second aspects, the invention comprises a board position recognizing step of taking, by an image pickup device, an image of the board held at the holding position on the board holding surface and of recognizing, by image, positional deviation amounts of the board relative to the holding position and that the compensated mounting position calculating step includes calculating the compensation amounts in the two orthogonal directions within the horizontal plane and in the vertical direction for the position of the mounting portion whose normal line is directed in the vertical direction at the board turning step, based on the positional deviation amounts, a turn amount of the holding member at the board turning step, the board holding device information and the board information.

The invention according to a fourth aspect resides in that in any one of the first to third aspects, the invention comprises a post-turn mounting position recognizing step of taking an image of the mounting portion by the image pickup device after the holding member is turned to direct the normal line to the position of the mounting portion in the vertical direction at the board turning step, and of recognizing, by image, the position of the mounting portion after the turn and a board re-compensated position calculating step of re-compensating the compensated mounting position by the difference between the position of the post-turn mounting portion recognized by image and the compensated mounting position calculated at the compensated mounting position calculating step and that the component mounting step includes mounting the component at the mounting portion on the board based on the compensated mounting position having been re-compensated.

The invention according to a fifth aspect resides in a board mounting apparatus which comprises a board holding device having a holding member that, in order to mount a component on a board having a non-planar component mounting surface, holds the board at a holding position on a board holding surface and turns the board; a board transfer device that loads and unloads the board with respect to the board holding surface of the holding member; a component supply device that supplies the component to be mounted on the board; a component loading device that picks up the component from the component supply device and moves the component in two orthogonal directions within a horizontal plane and in a vertical direction to mount the component at a mounting portion on the board held at the holding position on the board holding surface; and a control device that controls operations of the board holding device, the board transfer device, the component supply device and the component loading device; wherein the control device comprises input means for inputting board information that relates to the position of a positioned portion for positioning the board on the board holding surface and the position of the mounting portion and board holding device information that relates to the position in the board holding device of a turn shaft for the holding member, a positional relation between the turn shaft and the board holding surface and the position of the holding position on the board holding surface; memory means for storing the board information and the board holding device information inputted; board loading and holding means for loading the board to the holding position on the board holding surface by the board transfer device and for holding the loaded board at the holding position on the board holding surface by holding means provided in the board holding device; board turning means for turning the holding member of the board holding device so that a normal line to the mounting portion on the non-planar component mounting surface is directed in the vertical direction, based on the board information and the board holding device information; compensated mounting position calculating means for calculating compensation amounts in the two orthogonal directions within the horizontal plane and in the vertical direction for the position of the mounting portion whose normal line is directed in the vertical direction by the board turning means, based on a turn amount of the holding member by the board turning means, the board holding device information and the board information and for calculating a compensated mounting position from the compensation amounts in the two orthogonal directions within the horizontal plane and in the vertical direction and the board information; and component mounting means for mounting the component at the mounting portion on the board based on the compensated mounting position.

The invention according to a sixth aspect resides in that in the fifth aspect, the board holding device is constructed movably in the vertical direction and that the component mounting means compensatingly moves the board holding device in the vertical direction with respect to the compensation amount in the vertical direction calculated by the compensated mounting position calculating means.

The invention according to a seventh aspect resides in that in the fifth or sixth aspects, the invention comprises an image pickup device being able to take an image of the board; that the control device is provided with board position recognizing means for taking an image of the board held at the holding position on the board holding surface, by the image pickup device and for recognizing by image the positional deviation amounts of the board relative to the holding position; and that the compensated mounting position calculating means calculates compensation amounts in the two orthogonal directions within the horizontal plane and in the vertical direction for the position of the mounting portion whose normal line is directed in the vertical direction by the board turning means, based on the positional deviation amounts, the turn amount of the holding member by the board turning means, the board holding device information and the board information.

The invention according to an eighth aspect resides in that in any one of the fifth to seventh aspects, the holding member is composed of a first holding member that has a first turn shaft being able to turn about a horizontal axis, and a second holding member that has a second turn shaft being turnable about an axis orthogonal to the first turn shaft on the first holding member and that the board turning means individually turns the first holding member and the second holding member in the board holding device so that a normal line to the mounting portion on the non-planar component mounting surface is directed in the vertical direction, based on the board information and the board holding device information.

Effects of the Invention

According to the invention in the first aspect, the holding member in the board holding device is turned so that the normal line to the mounting portion on the non-planar component mounting surface is directed in the vertical direction, based on the board holding device information and the board information. Thus, after the component picked up by the component loading device is moved onto the normal line to the mounting portion, it is possible to mount the component at the mounting portion through a simple component mounting operation control that involves moving the component loading device in the vertical direction only. Therefore, there becomes unnecessary a complicated component mounting operation control that involves moving the component loading device in an inclined direction as is the case of the prior art, and thus, it becomes possible to prevent the positional deviations of the component at the mounting portion and to mount the component at the mounting portion in a short period of time. Further, the compensation amounts for the position of the mounting portion are calculated based on the turn amount of the holding member, the board holding device information and the board information, and the compensated mounting position is calculated from the compensation amounts for the position of the mounting portion and the board information. Thus, it is possible to calculate the compensated mounting position being accurate in the horizontal direction and the vertical direction. Accordingly, it is possible to mount the component at the mounting portion accurately.

According to the invention in the second aspect, the compensation in the vertical direction for the position of the mounting portion is performed by moving the board holding device in the vertical direction. Here, the component loading device is reciprocated between the component supply device and the board by the number of times corresponding to the number of components to be mounted, to perform the component mountings. In the case of a planar board, all of the mounting portions are set to become the fixed mounting reference height, and thus, it is possible to make the moving stroke in the vertical direction of the component loading device the minimum necessary and to shorten the component mounting time. However, in the case of the board having a non-planar component mounting surface, especially, in the case of, for example, a corrugated board that changes in the distance between the component mounting surface and the center of the turn shaft for the holding member in the board holding device, all of the mounting portions do not become the fixed mounting reference height. For this reason, the mounting portions are made to become the fixed mounting reference height by moving the board holding device in the vertical direction. Thus, it is possible to make the moving stroke in the vertical direction of the component loading device the minimum necessary. Accordingly, it can be realized to shorten the component mounting time in the case of mounting components on a board having a non-planar component mounting surface.

According to the invention in the third aspect, the positional deviation amounts of the board relative to the holding position on the board holding surface of the holding member are recognized by image, the compensation amounts for the position of the mounting portion are calculated based on the positional deviation amounts, the turn amount of the holding member, the board holding device information and the board information, and the compensated mounting position is calculated from the compensation amounts for the position of the mounting portion and the board information. Thus, it is possible to obtain the compensated mounting position being accurate by taking the positional deviation amounts into consideration. Accordingly, it is possible to mount the component at the mounting portion further accurately.

According to the invention in the fourth aspect, the position of the mounting position after the turn of the holding member in the board holding device is recognized by image, and the compensated mounting position is re-compensated by the difference between the position of the mounting portion and the compensated mounting position. Thus, even in the case that, for example, a hole is provided at the mounting portion for inserting the component thereinto and that the position in the horizontal direction of the center of the hole is changed by the turn of the holding member, the compensated mounting position at the mounting portion is heightened in accuracy by the re-compensation, and thus, the mounting can be done by smoothly inserting the component into the hole at the mounting portion.

According to the invention in the fifth aspect, the board turning means is configured to turn the holding member in the board holding device so that the normal line to the mounting portion on the non-planar component mounting surface is directed in the vertical direction, based on the board holding device information and the board information. Thus, after the component picked up by the component loading device is moved onto the normal line to the mounting portion, it is possible to mount the component at the mounting portion through a simple component mounting operation control that involves moving the component loading device in the vertical direction only. Therefore, there becomes unnecessary a complicated component mounting operation control that requires moving the component loading device in an inclined direction as is done in the prior art, and thus, it is possible to prevent the positional deviation of the component at the mounting portion and hence, to mount the component at the mounting portion in a short period of time. Further, the compensated mounting position calculating means is configured to calculate the compensation amounts for the position of the mounting portion based on the turn amount of the holding member, the board holding device information and the board information and to calculate the compensated mounting position from the compensation amounts for the position of the mounting portion and the board information. Thus, it is possible to obtain the compensated mounting position being accurate in the horizontal direction and the vertical direction. Accordingly, it is possible for the component mounting means to mount the component at the mounting portion accurately.

According to the invention in the sixth aspect, the component mounting means is configured to compensate the position in the vertical direction of the mounting portion on the non-planar component mounting surface by moving the board holding device in the vertical direction. For the aforementioned reason, in the case of the board having a non-planar component mounting surface, especially, in the case of, for example, a corrugated board that changes in the distance between the component mounting surface and the center of the turn shaft for the holding member in the board holding device, all of the mounting portions do not become a fixed mounting reference height. For this reason, the mounting portions are made to become the fixed mounting reference height by moving the board holding device in the vertical direction. Thus, it is possible to make the moving stroke in the vertical direction of the component loading device the minimum necessary. Accordingly, it can be realized for the component mounting means to shorten the component mounting time when mounting the component at the mounting portion.

According to the invention in the seventh aspect, the compensated mounting position calculating means is configured to calculate the compensation amounts for the position of the mounting portion based on the positional deviation amounts recognized by image, the turn amount of the holding member, the board holding device information and the board information and to calculate the compensated mounting position from the compensation amounts for the position of the mounting portion and the board information. Thus, it is possible to obtain the compensated mounting position being accurate by taking the positional deviation amounts into consideration. Accordingly, it is possible for the component mounting means to mount the component at the mounting portion further accurately.

According to the invention in the eighth aspect, the board turning means is configured to individually turn the first holding member and the second holding member in the board holding device so that the normal line to the mounting portion on the non-planar component mounting surface is directed in the vertical direction, based on the board information and the board holding device information. Thus, even in the case of, for example, the board of a spherical shape, it is possible to mount the component at the mounting portion by moving the component picked up by the component loading device, in the vertical direction only. Accordingly, through a simple component mounting operation control, it is possible to mount the component on a board having a component mounting surface that is more complicated and non-planar, accurately and in a short period of time.

BRIEF DESCRIPTION OF THE DRAWINGS

[FIGS. 10(A) and 10(B)] are illustrations showing the operations in mounting components at a first mounting position and a second mounting position on a board held on the board holding device in the component mounting apparatus in FIG. 1.

EMBODIMENTS FOR PRACTICING THE INVENTION

Figure 1:
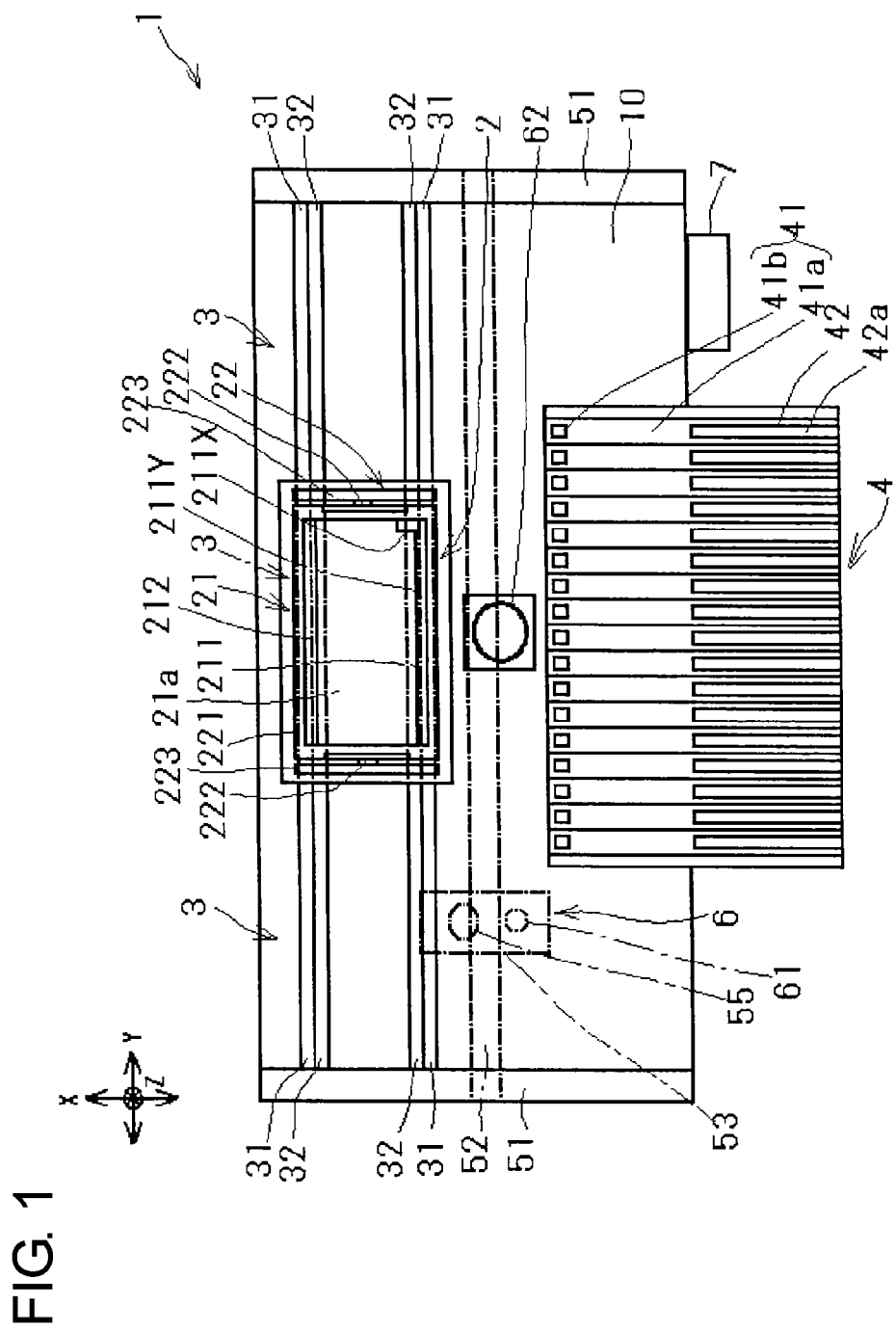
[FIG. 1] is a plan view schematically showing the whole construction of a component mounting apparatus in a first embodiment according to the present invention.
Figure 2:
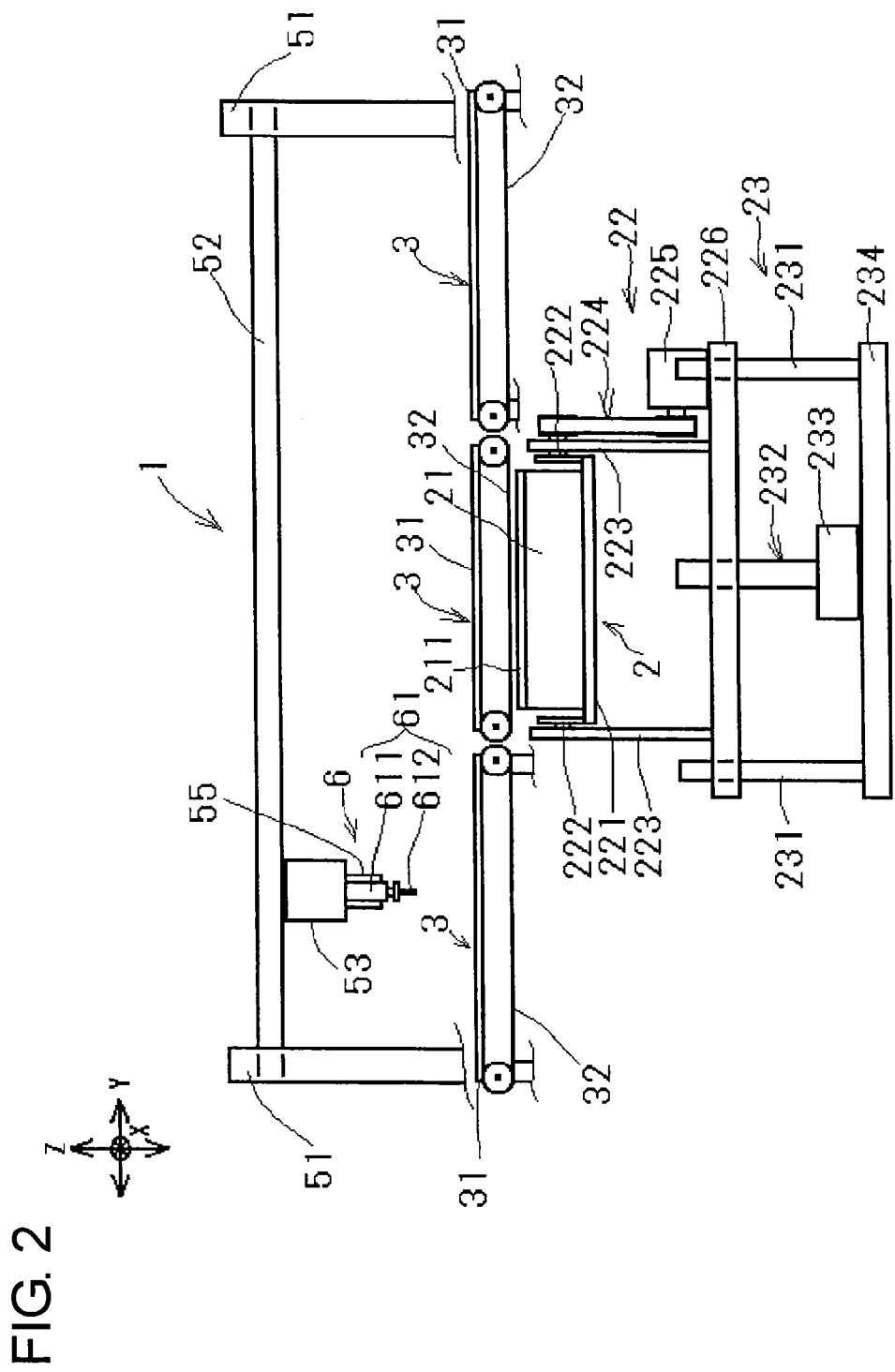
[FIG. 2] is a front view schematically showing a board holding device, a board transfer device and a component loading device in the component mounting apparatus in FIG. 1.
Figure 3:
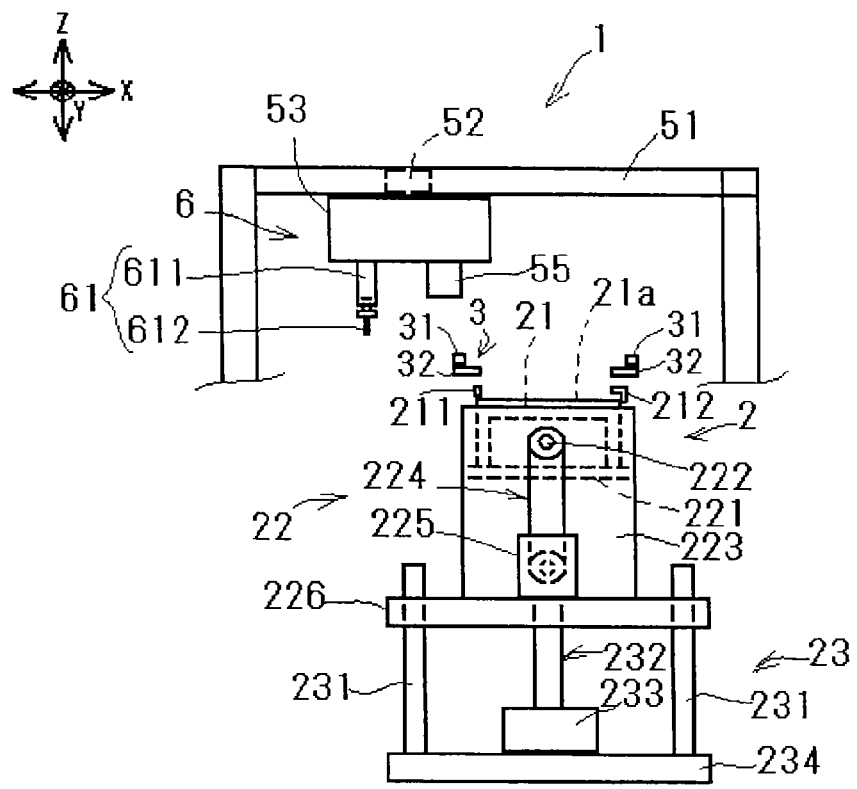
[FIG. 3] is a side view schematically showing the board holding device and the component loading device in the component mounting apparatus in FIG. 1.
Figure 4:
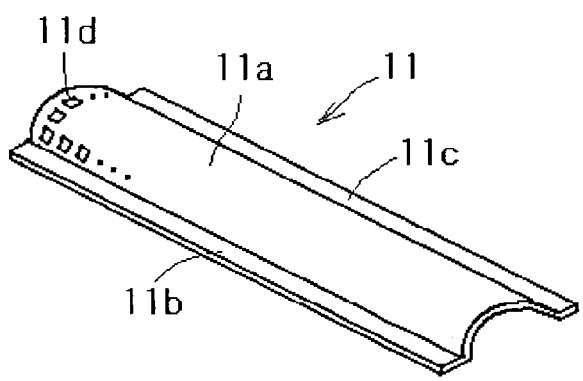
[FIG. 4] is a perspective view showing an example of a board on which components are mounted by the component mounting apparatus in FIG. 1.

Hereinafter, embodiments in the present invention will be described with reference to the drawings. In the figures, a board transfer direction is regarded as Y-direction, a horizontal direction orthogonal to the Y-direction is regarded as X-direction, and a vertical direction orthogonal to the Y-direction is regarded as Z-direction. First of all, a component mounting apparatus 1 in the first embodiment will be described. As shown in FIGS. 1-3, the component mounting apparatus 1 in the first embodiment is schematically constructed by a board holding device 2, three board transfer devices 3, a component supply device 4, a component loading device 6 and a control device 7 for controlling the operations of these devices 2-6. The component loading device 1 mounts components on a board 11 that has a non-planar component mounting surface 11a for example, as shown in FIG. 4.

The board 11 is formed to a rectangular shape in a top view and to a shape that has a portion of a circular arc shape and portions protruding outward from the opposite ends of the circular arc, in a side view. That is, the board 11 is formed to a shape that is made by cutting the circular arc portion at end portions of a hollow cylindrical member in the axial direction and by respectively integrating belt-like members with the respective cutoff portions. The circumferential surface on the circular arc shape of the board 11 is formed as a component mounting surface 11a on which a plurality of components are respectively mounted at a plurality of mounting portions 11d provided in, for example, a grid-like fashion. Further, the belt-like portions of the board 11 are formed as a positioned portion 11b that is contacted with a positioning guide 211 serving as holding means referred to later in the board holding device 2, and a clamped portion 11c that is clamped by a clamping member 212 serving as holding means in the board holding device 2.

As shown in FIGS. 1-3, the board holding device 2 is arranged at the center on the deep side (the upper side center in FIG. 1) on an upper surface of a base 10, is constructed so that the board 11 transferred over a board holding table 21 by the board transfer device 3 can be loaded from the board transfer device 3 onto a board holding surface 21a through the upward movement of the board holding table 21 in the Z-direction by a moving device 23 referred to later, and is also constructed so that the board 11 can be loaded from the board holding surface 21a onto the board transfer device 3 through the downward movement of the board holding table 21 in the Z-direction by the moving device 23. Further, in order to mount components on the board 11 by a method referred to later, the board holding device 2 is a device that turns the board 11 while holding the same at holding positions 211X, 211Y referred to later. The board holding device 2 is generally composed of the board holding table 21 as holding member that mounts and holds the board 11, a turn device 22 that turns the board 11 held on the board holding table 21 together with the board holding table 21 about an axis in the Y-direction, and the moving device 23 that moves the board 11 held on the board holding table 21 together with the board holding table 21 and the turn device 22 in the Z-direction.

The board holding table 21 is formed to the shape of a rectangular parallelepiped, and an upper surface thereof is formed as the board holding surface 21*a* on which the board 11 is mounted and held. The board holding surface 21*a* is provided with an L-shape positioning guide 211 that contacts two orthogonal side portions of the positioned portion 11*b* of the board 11 to be mounted to position and hold the board 11 in the X-axis direction and Y-axis direction, and the clamping member 212 that presses an upper surface of the clamped portion 11*c* to clamp the board 11 between itself and the board holding surface 21*a*. The contact positions in the X and Y-directions on the positioning guide 211 with the positioned portion 11*b* of the board 11 are set as the holding positions 211*x*, 211*y* on the board holding surface 21*a* for the board 11. The clamping member 212 is constructed to be able to clamp or unclamp the board 11 when brought close to, or separated from, the board holding surface 21*a*.

The turn device 22 is generally composed of a turn table 221 fixedly mounting the board holding table 21 and being turnable about a pair of turn shafts 222 respectively extending from the opposite ends outward in the Y-direction, a pair of support members 223 respectively supporting the pair of turn shafts 222 to be turnable, a belt-pulley mechanism 224 and a stepping motor 225 for turning the turn shafts 222 for the turn table 221, and a seat table 226 securing thereto the support members 223 and the stepping motor 225. The board holding table 21 is constructed to be able to be positioned to any turn positions by the stepping motor 225.

The moving device 23 is generally composed of four guide members 231 passing through four corners of the seat table 226 of the turn device 22 and guiding the movement of the seat table 226 in the Z-direction, a ball screw-nut mechanism 232 and a stepping motor 233 for moving the seat table 226 in the Z-direction, and a seat table 234 securing thereto the four guide members 231 and the stepping motor 233. The board holding table 21 is constructed to be able to be positioned by the stepping motor 233 to any positions in the Z-direction.

The three board transfer devices 3 are respectively arranged to make a straight line over the board holding device 2 and on the opposite sides in the Y-direction of the board holding device 2. The board transfer device 3 on one side in the Y-direction loads the board 11 prior to component mounting onto the board holding device 2, the board transfer device 3 over the board holding device 2 positions the loaded board 11 to a component mounting position, and the board transfer device 3 on the other side in the Y-direction is a device that unloads the board 11 after component mounting from the board holding device 2. The respective board transfer devices 3 are the same in construction and are each composed generally of a pair of the guide rails 31 for guiding the transfer of the board 11 and a pair of conveyor belts 32 for transferring the board 11. The pair of the guide rails 31 extend in the Y-direction and are arranged in parallel with each other to be spaced almost the same distance as the width between the positioned portion 11*b* and the clamped portion 11*c* of the board 11. The pair of the conveyor belts 32 are juxtaposed directly under the guide rails 31.

The component supply device 4 is a device that is arranged on the front side (lower side in FIG. 1) on an upper surface of the base 10 and that supplies components of different kinds received in a plurality of cassette-type feeders 41. Each feeder 41 is generally composed of a feeder main body 41*a* with a component supply reel 42 set on its rear portion and a component takeout portion 41*b* provided on a front portion of the feeder main body 41*a*. The component supply reel 42 winds therearound a carrier tape 42*a* on which components are arranged at regular pitches and are covered by a cover tape (not shown). The feeder 41 is constructed to pull out the carrier tape 42*a* at regular pitches by a sprocket wheel (not shown) provided in the feeder main body 41*a* and to peel the cover tape off whereby components are fed successively to the component takeout portion 41*b* as the carrier tape 24*a* is taken up.

The component loading device 6 is a device that is arranged over the upper surface of the base 10 and that picks up components from the component supply device 4 and mounts the components on the board 11 transferred to the board holding device 2. The component loading device is generally composed of a pair of fixed rails 51, a head moving rail 52, a component loading head 53 and a component attraction unit 61 for attracting a component.

The pair of fixed rails 51 extend in the X-direction over the opposite end portions of the two board transfer devices 3 and are arranged in parallel with each other. The head moving rail 52 is arranged to extend in the Y-axis direction and is supported movably along the pair of fixed rails 51 at opposite ends thereof. The movement of the head moving rail 52 is controlled by servomotors (not shown) through ball screws (not shown). The component loading head 53 is supported movably along the head moving rail 52. The movement of the loading head 53 is controlled by a servomotor (not shown) through a ball screw (not shown).

The component attraction unit 61 is generally composed of a nozzle holder portion 611 provided to protrude downward from the component loading head 53 and a component attraction nozzle 612 provided at a lower end portion of the nozzle holder portion 611 for attracting and holding the component. The nozzle holder portion 611 is supported on the component loading head 53 to be vertically movable in the Z-direction and rotatable about the Z-axis by servomotors (not shown). The component attraction nozzle 612 is attached to a lower end portion of the nozzle holder portion 611 and is connected to a vacuum pump (not shown) so that a component can be attracted by the nozzle end. Further, in order to recognize, by image, positional deviations or the like of the board 11 relative to the holding positions 211*x*, 211Y on the board holding surface 21*a*, a board image pickup camera 55 as image pickup device for picking up the image of the board 11 is provided to protrude downward from the component loading head 53. Further, in order to recognize the attraction state of the component on the nozzle holder portion 611, a component image pickup camera 62 for picking up the image of the component is attached between the board holding device 2 and the component supply device 4.

Figure 5A:
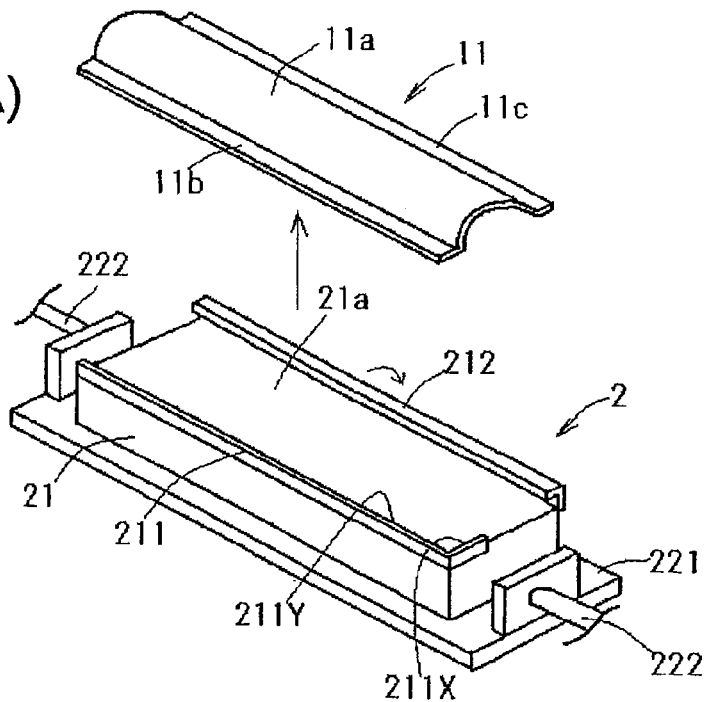
[FIGS. 5(A) and 5(B)] are perspective views showing states before and after the board is loaded onto the board holding device in the component mounting apparatus in FIG. 1.

In the component mounting apparatus 1 of the first embodiment as described above, description will be made regarding the operation of holding the board 11 on the board holding device 2. As shown in FIG. 5(A), the board 11 is transferred by the board transfer device 3 (not shown) to the upper side of the board holding device 2 and is positioned to a predetermined position. Then, the clamping member 212 of the board holding table 21 in the board holding device 2 is opened outward, and the board holding table 21 begins to move upward (referred to FIG. 5(A)). Thus, the board 11 is loaded from the board transfer device 3 onto the board holding surface 21*a* of the board holding table 21.

Figure 5B:
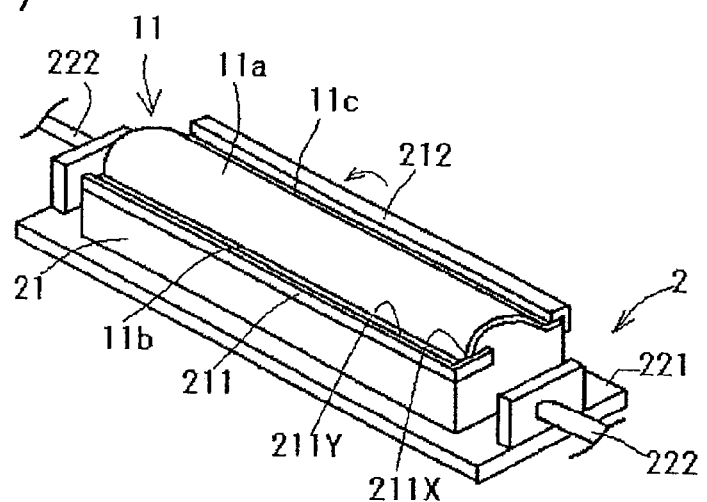

At this time, the two side portions in the X-direction and the Y-direction of the positioned portion 11*b* of the board 11 are contacted with the holding positions 211*x*, 211Y on the positioning guide 211 of the board holding device 2 to be positioned, and the clamped portion 11*c* of the board 11 is clamped by the clamping member 212 of the board holding device 2 (referred to FIG. 5(B)). Thereafter, as described later in detail, the board holding table 21 is turned about the turn shafts 222 to direct a normal line to each mounting portion 11d of the board 11 in the Z-direction (vertical direction), and if necessary further, the board holding table 21 is moved in the Z-direction (vertical direction) to position the mounting portion 11d to a mounting reference height. Thereafter, a component is mounted on each mounting portion 11d of the board 11.

Figure 6A:
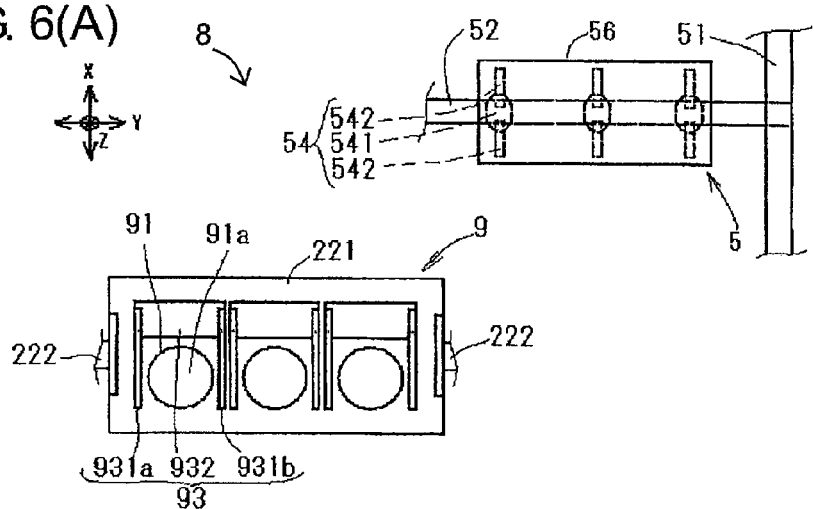
[FIGS. 6(A) and 6(B)] are a plan view and a front view schematically showing a board holding device in a component mounting apparatus in a second embodiment according to the present invention.
Figure 6B:
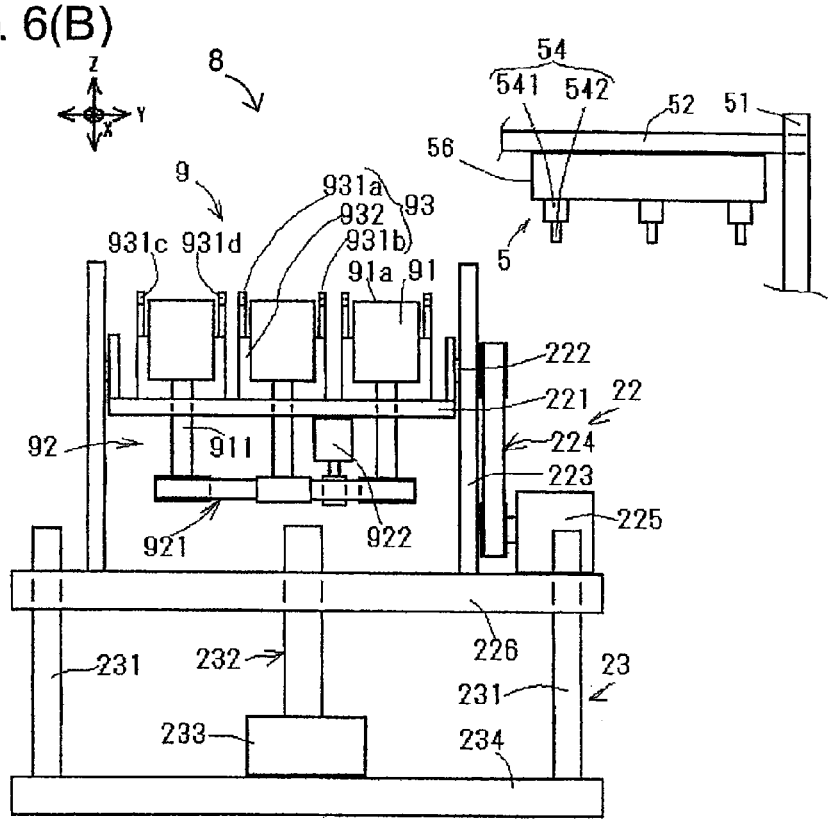
Figure 7:
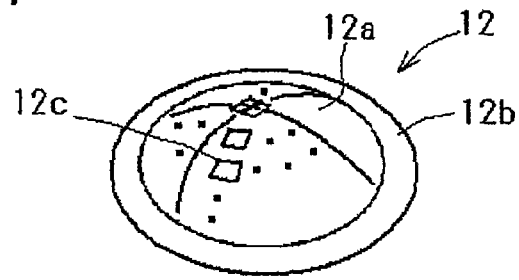
[FIG. 7] is a perspective view showing an example of a board on which components are mounted by the component mounting apparatus in FIGS. 6(A) and 6(B).

Next, a component mounting apparatus 8 in a second embodiment will be described. As compared with the component mounting apparatus 1 in the first embodiment, the component mounting apparatus 8 in the second embodiment is the same in the constructions of the two board transfer devices 3 which, of the three board transfer devices 3, are arranged on the opposite sides in the Y-direction of the board holding device 2, the component supply device 4, the component loading device 6 and the control device 7. However, as shown in FIGS. 6(A) and 6(B), a board holding device 9 differs from the board holding device 2 in construction, and the board transfer device 3 over the board holding device 2 is not provided, wherein there is newly provided a board loading device 5. Therefore, the board holding device 9 and the board loading device 5 will be described hereinafter. The component mounting apparatus 8 mounts components on a board 12 having a non-planar component mounting surface 12a for example, as shown in FIG. 7.

The board 12 is formed to a circular shape in a top view and is formed to a shape that in a side view, has a portion of a circular arc shape and portions protruding outward from the opposite ends of the circular arc. That is, the board 12 is formed to a shape that is made by cutting off a part of a spherical member in the direction parallel to the radial direction and by integrating a ring-shape member with the cutoff portion. The spherical peripheral surface of the board 12 is formed as a component mounting surface 12a on which a plurality of components are to be respectively mounted at a plurality of mounting portions 12c that are provided in, for example, concentric configurations. Further, the ring-shape portion of the board 12 is formed as a positioned portion 12b that is inserted and held in a position holding device 93 as holding means of the board holding device 9 referred to later to be positioned and clamped.

As shown in FIG. 6, the board holding device 9 is generally composed of a plurality (three in this embodiment) of board holding tables 91 that mount and hold boards 12 loaded by the board loading device 5 from the board transfer device 3, a holding table swiveling device 92 that turns the boards 12 held on the respective board holding tables 91 together with the board holding tables 91 in the circumferential directions of the boards 12, a plurality (three in this embodiment) of positioning devices 93 that insert and hold therein the boards 12 held on the respective board holding tables 91 to position and clamp the boards 12, a turn device 22 that turns the boards 12 held on the respective board holding tables 91 together with the board holding tables 91 about the axis in the Y-direction, and a moving device 23 that moves the boards 12 held on the respective board holding tables 91 together with the board holding tables 91 and the turn device 22 in the Z-direction. The turn device 22 and the moving device 23 of the board holding device 9 are the same in construction as those in the first embodiment, and the same reference numerals are given to the identical members, of which detailed description will be omitted.

Each board holding table 91 is formed to a columnar shape and has an upper surface formed as a board holding surface 91a on which the board 12 is mounted and held. Further, each board holding table 91 is provided with a swivel shaft 911 that extends downward from the lower surface and that is rotatably supported by a turn table 221. That is, each board holding table 91 is constructed as a second holding member that is on the turn table 221 as a first holding member to be turnable about the turn shafts 222 as a first turn shaft and that is turnable about the swivel shaft 911 as a second turn shaft extending in a direction perpendicular to the turn shafts 222.

The holding table swiveling device 92 is generally composed of a belt-pulley mechanism 921 for turning the respective swivel shafts 911 and a stepping motor 922 secured to a lower surface of the turn table 221. Each of the board holding tables 91 is constructed to be positioned to any swivel positions by the stepping motor 922.

Each positioning device 93 is juxtaposed with each board holding table 91 and is secured to the upper surface of the turn table 221. Each positioning device 93 is generally composed of a pair of positioning arms 931a, 931b as holding means that enables the positioned portion 12b of the board 12 to be inserted and held therein, and an arm moving device 932 comprising a motor, a gear mechanism and the like that move the positioning arm 931b only on one side parallel relative to the positioning arm 931a on the other side. The positioning arm 931a is fixed to the upper surface of the turn table 221, and the positioning arm 931b is coupled to the arm moving device 932 to be movable parallel relative to the positioning arm 931a. The pair of positioning arms 931a, 931b are respectively provided with longitudinally extending groove portions 931c, 931d facing each other.

The positioning device 93 is constructed to position and clamp the board 12 on the board holding surface 91a in such a manner that the positioning arm 931b on the one side is moved parallel relative to the positioning arm 931a on the other side whereby the positioned portion 12b of the board 12 mounted on the board holding surface 91a is inserted into the respective groove portions 931c, 931d and is held therein. Therefore, the bottom position of the groove portion 931c of the fixed positioning arm 931a is set as reference position for the holding position of the board 12 on the board holding surface 91a.

The board loading device 5 is a device that is arranged over the upper surface of the base 10 and that loads the boards 12 between the board transfer devices 3 and the board holding device 9. The board loading device 5 is generally composed of a board loading head 56 and board gripping units 54 for gripping the boards 12. Like the component loading head 53, the board loading head 56 is supported movably along the head moving rail 52. The movement of the board loading head 56 is controlled by a servomotor (not shown) through a ball screw (not shown).

The board gripping units 54 are generally composed of a plurality (three in this embodiment) of claw holder portions 541 that are provided to protrude downward from the board loading head 56, and pairs of board gripping claws 542 that are respectively provided at lower end portions of the respective claw holder portions 541 for gripping the boards 11. The claw holder portion 541 is supported by the board loading head 56 to be movable in the Z-direction and turnable about the Z-axis by servomotors (not shown). Each pair of board gripping claws 542 are attached to a lower end portion of the claw holder portion 541 to be openable and closable by a servomotor (not shown). The intervals of the three board gripping units 54 are provided to be the same as the intervals of the three board holding tables 91. Further, the board transfer device 3 on the loading side for the boards 12 is provided with stoppers (not shown) that stop the three loaded boards 12 at the intervals of the three board gripping units 54. Thus, the three board gripping units 54 are constructed to be able to load the three boards 12 at a time between the board transfer device 3 and the board holding device 9.

Figure 8A:
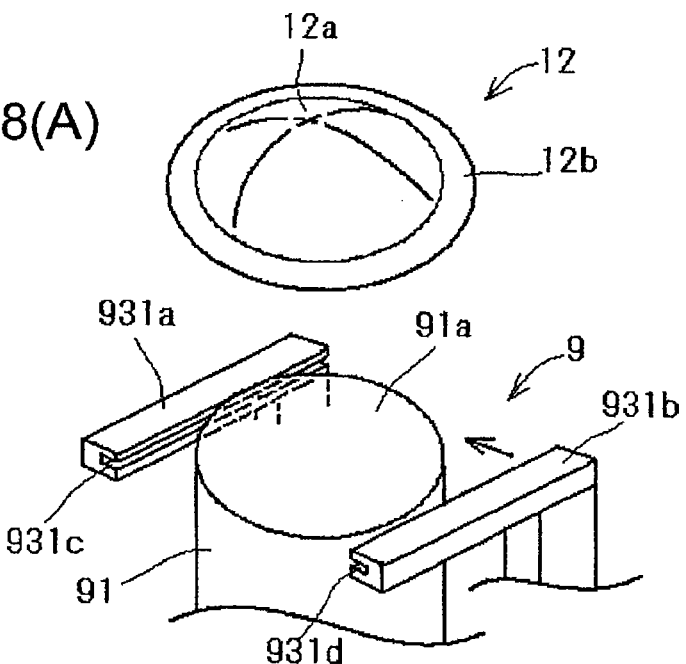
[FIGS. 8(A) and 8(B)] are perspective views showing states before and after the board is loaded onto the board holding device in the component mounting apparatus in FIGS. 6(A) and 6(B).
Figure 8B:
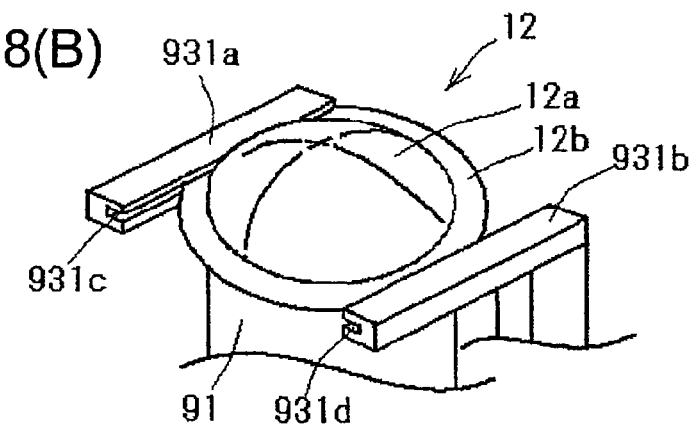

In the component mounting apparatus 8 in the second embodiment of the aforementioned construction, description will be made regarding the operation of holding the boards 12 on the board holding device 9. As shown in FIGS. 8(A) and 8(B), after being transferred by the board transfer device 3 to the vicinity of the board holding device 9, each board 12 is moved by the board loading device 5 from the board transfer device 3 to an upper position over the board holding table 91 of the board holding device 9 (refer to FIG. 8(A)). Then, the board 12 is placed by the board loading device 5 onto the board holding surface 91a of the board holding table 91. At this time, the positioned portion 12b of the board 12 is put between the pair of positioning arms 931a, 931b of the positioning device 93 and is positioned and clamped (refer to FIG. 8(B)). Thereafter, as described later in detail, the board holding table 91 is turned about the turn shafts 222 and about the swivel shaft 911 to direct a normal line to each mounting portion 12c n the board 12 in the Z-direction (vertical direction). If necessary further, the board holding table 91 is moved in Z-direction (vertical direction) to position the mounting portion 12c at a fixed mounting reference height. Then, a component is mounted on each mounting portion 12c of the board 12.

Next, description will be made regarding the reasons why the board holding table 21, 91 is turned and the like to direct the normal line to the mounting portion 11d, 12c on the board 11, 12 in the Z-direction (vertical direction) and to position the mounting portion 11d, 12c at the fixed mounting reference height. The component mounting surface 11a, 12a of the board 11, 12 is a circular arc shape in a side view and hence, when the normal line to the mounting portion 11d, 12c is inclined relative to the axis in the Z-direction, the component attraction nozzle 612 has to be moved in an inclined direction, which requires a complicated operation control. On the other hand, when in order to simplify the operation control of the component attraction nozzle 612, a component is mounted by moving the component attraction nozzle 612 in the Z-direction, an anxiety arises in that a deviation takes place in the position of the component.

The component attraction nozzle 612 is reciprocatively moved between the component supply device 4 and the board 11, 12 by the number of times corresponding to the number of components to be mounted, to perform component mountings. In the case of a board being a planar shape, all of mounting portions are set to become a fixed mounting reference height. Thus, the moving stroke in the vertical direction of the component attraction nozzle 612 can be made to be the minimum necessary, so that it is possible to shorten the component mounting time. However, in the case of the boards 11, 12 having a non-planar component mounting surface, all of the mounting portions do not become a fixed mounting reference height. Thus, it may be the case that the moving stroke in the vertical direction of the component attraction nozzle 612 becomes longer, and the component mounting time tends to become longer. Therefore, in the component mounting apparatus 1, 8 in the present embodiment, the aforementioned problems are solved by performing a compensation that turns the board holding table 21, 91 of the board holding device 2, 9 and, if need be, moves the board holding table 21, 91 in the Z-direction, to direct the normal line to the mounting portion 11d, 12c in the Z-direction and to position the mounting portion 11d, 12c at the mounting reference height.

In the aforementioned compensation method, there are used information on the board 11, 12 and information on the board holding device 2, 9. The information on the board 11, 12 includes the position of the positioned portion 11b, 12b, positions of the mounting portions 11d, 12c and the like. The position of the positioned portion 11b, 12b is represented by the respective coordinates in the X, Y, Z-directions of the two orthogonal sides of the positioned portion 11b that are brought into contact with the positioning guide 211, and is used when components are mounted with the board 11, 12 positioned and held on the board holding table 21, 91. On the other hand, where components are mounted with the board 11, 12 recognized as image by the image pickup camera 55, a reference hole (not shown) formed in advance on the board 11, 12 is used as a positioned portion, and thus, the position of the reference hole is used as board information in place of the position of the positioned portion 11b, 12b. The position of each mounting portion 11d, 12c is represented by the respective coordinates in the X, Y, Z-directions and the inclinations in the X and Y-directions.

As information on the board holding device 2, 9 includes the position in the board holding device 2, 9 of the turn shafts 222 for the board holding table 21, 91, the positional relation between the turn shafts 222 and the board holding surface 21a, 91a, the holding positions 211x, 211Y of the board holding surface 21a and the like. With respect to the holding position on the board holding surface 91a, as aforementioned earlier, the bottom position of the groove portion 931c of the positioning arm 931a is set as the reference position. Respective coordinates in the X, Y, Z-directions are used to represent the position in the board holding device 2, 9 of the turn shafts 222 for the board holding table 21, 91, the positional relation between the turn shafts 222 and the board holding surface 21a, 91a and the holding positions 211x, 211Y of the board holding surface 21a.

The turn of the board holding table 21, 91 in the board holding device 2, 9 is performed to direct the normal line to each mounting portion 11d, 12c in the Z-direction, based on the aforementioned information on the board 11, 12 and the information on the board holding device 2, 9. Thus, after the component picked up by the component attraction nozzle 612 is moved onto the normal line to each mounting portion 11d, 12c, it is possible to mount the component on the mounting portion 11d, 12c through a simple component mounting operation control that includes moving the component attraction nozzle 612 in the vertical direction only. Therefore, there is not required a complicated component mounting operation control that involves moving the component attraction nozzle 612 in an inclined direction as is done in the prior art, and a positional deviation of the component at each mounting portion 11d, 12c can be prevented, so that it is possible to mount the component at the mounting portion 11d, 12c within a short period of time.

Further, compensation amounts in the X, Y, Z-directions of the position of each mounting portion 11d, 12c are calculated based on the turn amount of the board holding table 21, 91, the information on the board 11, 12 and the information on the board holding device 2, 9. The movement in the Z-direction of the board holding table 21, 91 in the board holding device 2, 9 is performed based on a calculated compensation amount in the Z-direction of the position of each mounting portion 11d, 12c. A compensated mounting position of each mounting portion 11d, 12c is calculated from the calculated compensation amounts in the X, Y, Z-directions for the position of each mounting portion 11d, 12c and the information on the board 11, 12. A component is mounted accurately at each mounting portion 11d, 12c on the board 11, 12 based on the compensated mounting position of each such mounting portion 11d, 12c calculated in this manner.

Further, where components are mounted with the board 11, 12 recognized as image by the board image pickup camera 55, an image recognition is made for positional deviation amounts of the board 11, 12 relative to the holding positions 211x, 211Y and the like. Then, compensation amounts in the X, Y, Z-directions for the position of each mounting portion 11d, 12c are calculated based on the positional deviation amounts recognized as image, the turn amount of the board holding table 21, 91, the information on the board 11, 12 and the information on the board holding device 2, 9. Therefore, because the positional deviation amounts are added, components can be mounted further accurately at respective mounting portions 11d, 12c on the board 11, 12.

Further, the component mounting may be done after the position of each mounting portion 11d, 12c on the board 11, 12 is recognized by image subsequently to the turn of the board holding table 21, 91 in the board holding device 2, 9. In this case, the compensated mounting position of the mounting portion 11d, 12c is re-compensated for the difference only between the position of the mounting portion 11d, 12c on the board 11, 12 recognized by image and the compensated mounting position calculated for the mounting portion 11d, 12c. As a result, even in the case that for example, a hole for insertion of a component is provided at the mounting portion 11d, 12c and that the position in the horizontal direction of the center of the hole is changed due to the turn of the board holding table 21, 91, the accuracy of the compensated mounting position of the mounting portion 11d, 12c is heightened through the re-compensation, and hence, it is possible to mount the component by smoothly inserting the same into the hole at the mounting portion 11d, 12c.

The aforementioned compensation amounts in the X, Y, Z-directions for the position of each mounting portion 11d, 12c are deviation amounts between the position coordinates in the machine coordinate system (component mounting apparatus 1) of the mounting portion 11d, 12c when the board 11, 12 is loaded onto the board holding table 21, 91, and the position coordinates in the machine coordinate system of the mounting portion 11d, 12c when the board holding table 21, 91 is turned.

Figure 9A:
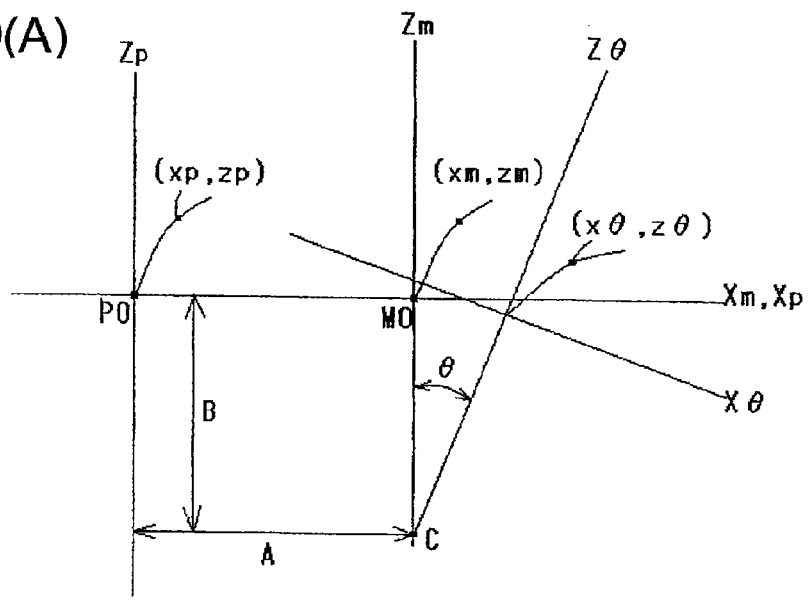
[FIGS. 9(A) and 9(B)] are a graphic showing coordinates for explaining a method of calculating compensation amounts in X, Y and Z-directions for the position of a mounting portion and a graphic showing the details of the coordinates.
Figure 9B:
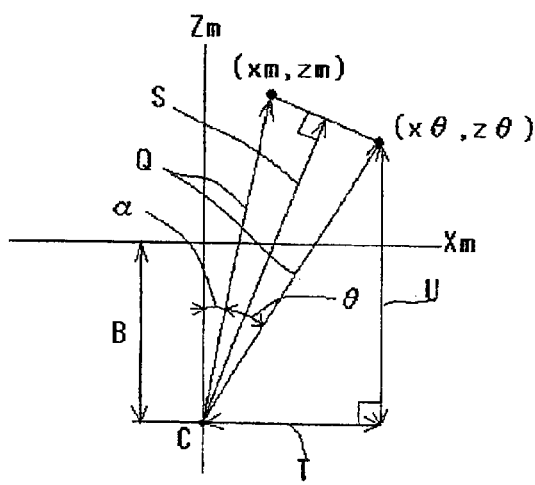

In consideration of the X and Z-directions taken, for example, as shown in FIGS. 9(A) and 9(B), the machine coordinate system are regarded as Xm and Zm, wherein Zm extends in the vertical direction across a turn center C of the board holding table 21, 91 and wherein Xm is set to be orthogonal to Zm and to extend along the board holding surface 21a, 91a being horizontal of the board holding table 21 91, and the mechanical origin is regarded as MO. Further, the board coordinate system on the board holding surface 21a, 91a is regarded as Xp and Zp, wherein Zp extends in the vertical direction and wherein Xp is set to be orthogonal to Zp and to become the same line as Xm, and the board origin is regarded as P0. Then, the distance between the mechanical origin M0 and the turn center C is regarded as zero in the X-direction and as B in the Z-direction, and the distance between the board origin P0 and the turn center C is regarded as A in the X-direction and as B in the Z-direction. Further, Xθ and Zθ are taken as the rotating coordinate system that is set when the machine coordinate system Xm, Zm is turned by an angle θ clockwise about the turn center C. In the case of the image recognition by the board image pickup camera 55, the distance in the X-direction is calculated by adding a camera deviation amount ΔA to the A.

The aforementioned deviation amounts can be derived first by parallel moving the board coordinate system Xp, Zp (moving through the distance A in the X-direction) to come into agreement with the machine coordinate system Xm, Zm and then, by turning the board coordinate system Xp, Zp being in agreement with the machine coordinate system Xm, Zm about the turn center C (turning by an angle θ clockwise).

For example, where the position coordinates of the mounting portion 11d, 12c in the board coordinate system Xp, Zp are regarded as (xp, zp), the following expression (1) is obtained by converting the coordinates (xp, zp) into the coordinates (xm, zm) in the machine coordinate system Xm, Zm.

$$xm = xp + A, \; zm = zp \quad (1)$$

Subsequently, the coordinates (xm, zm) are converted into the coordinates (xθ, zθ) in the rotating coordinate system Xθ, Zθ. Where Q is regarded as the distance from the coordinates (xm, zm) to the turn center C, the following expression (2) is obtained.

$$Q = \sqrt{((B+zm)^2 + xm^2)} \quad (2)$$

Then, where S is regarded as the distance from the line connecting the coordinates (xm, zm) and the coordinates (xθ, zθ) to the turn center C, the following expression (3) is obtained.

$$S = Q \cdot \cos \theta/2 \quad (3)$$

Then, where T is regarded as the distance from a straight line that extends from the coordinates (xθ, zθ) in parallel to the Zm, to the turn center C, the following expression (4) is obtained. There is set $\alpha = \cos^{-1}((B+zm)/Q)$.

$$T = 2S \cos(\pi - \theta/2 - \alpha) - xm \quad (4)$$

Then, where U is regarded as the distance from a straight line that extends from the turn center C in parallel to Xm, to the coordinates (xθ, zθ), the following expression (5) is obtained.

$$U = \sqrt{(Q^2 - T^2)} \quad (5)$$

From the above, the coordinates (xθ, zθ) can be converted by the following expression (6) into those in the machine coordinate systems Xm, Zm.

$$\begin{aligned} x\theta &= T \\ &= 2S \cos(\pi - \theta/2 - \alpha) - xm, \\ z\theta &= U - B \\ &= \sqrt{(Q^2 - T^2)} - B \\ &= \sqrt{(((B+zm)^2 + xm^2) - (2S\cos(\pi - \theta/2 - \alpha) - xm)^2)} - B \end{aligned} \quad (6)$$

Therefore, it is possible to calculate the deviation amounts between the position coordinates in the machine coordinate system of the mounting portion 11d, 12c when the board 11, 12 is loaded onto the board holding table 21, 91, and the position coordinates in the machine coordinate system of the mounting portion 11d, 12c when the board holding table 21, 91 is turned, that is, the compensation amounts in the X and Z-directions for the position of the mounting portion 11d, 12c.

Next, the aforementioned compensation method will be described giving a specific example. First of all, description will be made in the case that as shown in FIGS. 10(A) and 10(B), the center Cp of a curvature circle on the component mounting surface 11a, 12a of each board 11, 12 is in agreement with the center C of the turn shafts 222 for the board holding table 21, 91 in the board holding device 2, 9, that is, in the case that the distance between the component mounting surface 11a, 12a of each board 11, 12 and the center C of the turn shafts 222 for the board holding table 21, 91 is fixed at all times. When the board holding surface 21a, 91a of the board holding table 21, 91 is in a horizontal state, a first mounting portion Pa at the top of the component mounting surface 11a, 12a of the board 11, 12 directs a normal line Lpa thereto in the Z-direction and is positioned at a mounting reference height H (refer to FIG. 10(A)). Therefore, it is possible to mount a component at the first mounting portion Pa accurately and within a short period of time through a simple operation control that includes moving the component attraction nozzle 612 through a minimum stroke in the Z-direction only.

Thereafter, when a component is to be mounted at a second mounting portion Pb that is spaced counterclockwise an angle θ degree from the first mounting portion Pa, the board holding surface 21a, 91a of the board holding table 21, 91 is inclined by the θ degree, that is, the board holding table 21, 91 is turned clockwise the θ degree (refer to FIG. 10(B)). Thus, it is possible to make an adjustment so that the normal line Lpb to the second mounting portion Pb is directed in the Z-direction and that the second mounting portion Pb is positioned at the mounting reference height H. Therefore, it is possible to mount the component at the second mounting portion Pb accurately and within a short period of time through a simple operation control that includes moving the component attraction nozzle 612 through the minimum stroke in the Z-direction only.

Figure 11A:
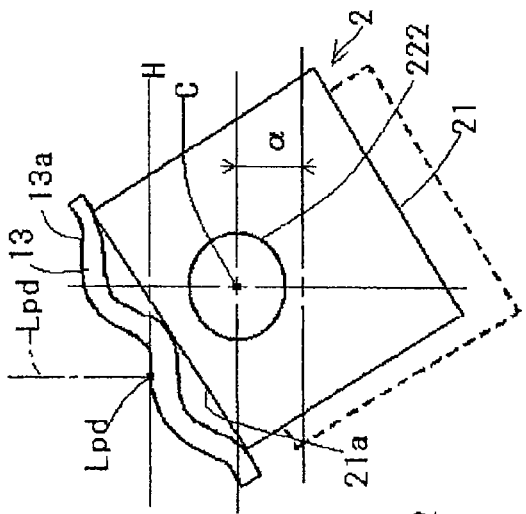
[FIG. 11(A)] is an illustration showing the operation in mounting a component at a first mounting position on a board held on the board holding device in the component mounting apparatus in FIG. 1, and [FIGS. 11(B) and 11(C)] are illustrations showing the operations in mounting a component on a second mounting position.
Figure 11B:
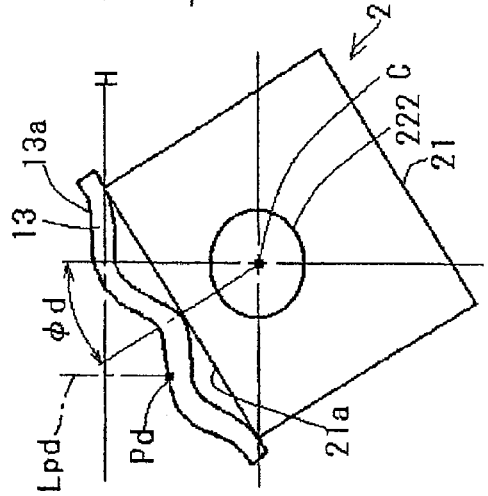

Next, description will be made regarding the case of, for example, a corrugated board 13 wherein the distance between a component mounting surface 13a of a board 13 and the center C of the turn shafts 222 for the board holding table 21, 91 is varied as shown in FIGS. 11(A) and 11(B). For a third mounting portion Pc that directs a normal line Lpc thereto in the Z-direction and is positioned at the mounting reference height H when the board holding surface 21a, 91a of the board holding table 21, 91 is inclined an degree Φc from the horizontal state to a downward-sloping state, the board holding surface 21a, 91a is turned clockwise the Φc degree (refer to FIG. 11(A)). Therefore, it is possible to mount the component at the third mounting portion Pc accurately and within a short period of time through a simple operation control that includes moving the component attraction nozzle 612 through the minimum stroke in the Z-direction only.

Figure 11C:
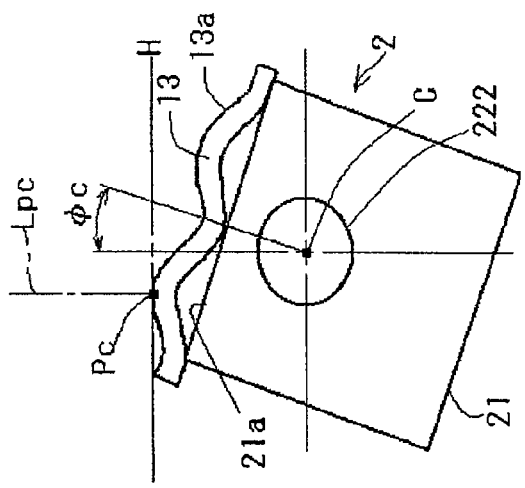

Then, for a fourth mounting portion Pd that directs a normal line Lpd thereto in the Z-direction when the board holding surface 21a, 91a of the board holding table 21, 91 is inclined an degree φd from the horizontal state to an upward-sloping state, the board holding surface 21a, 91a in the state of having been turned clockwise the φc degree is turned counterclockwise an angle of φc+φd degree (refer to FIG. 11(B)). In this case, because the fourth mounting portion Pd is not positioned at the mounting reference height H, the board holding table 21, 91 is moved a in the Z-direction (refer to FIG. 11(C)). Therefore, it is possible to mount the component at the fourth mounting portion Pd accurately and within a short period of time through a simple operation control that includes moving the component attraction nozzle 612 through the minimum stroke in the Z-direction only.

Figure 12:
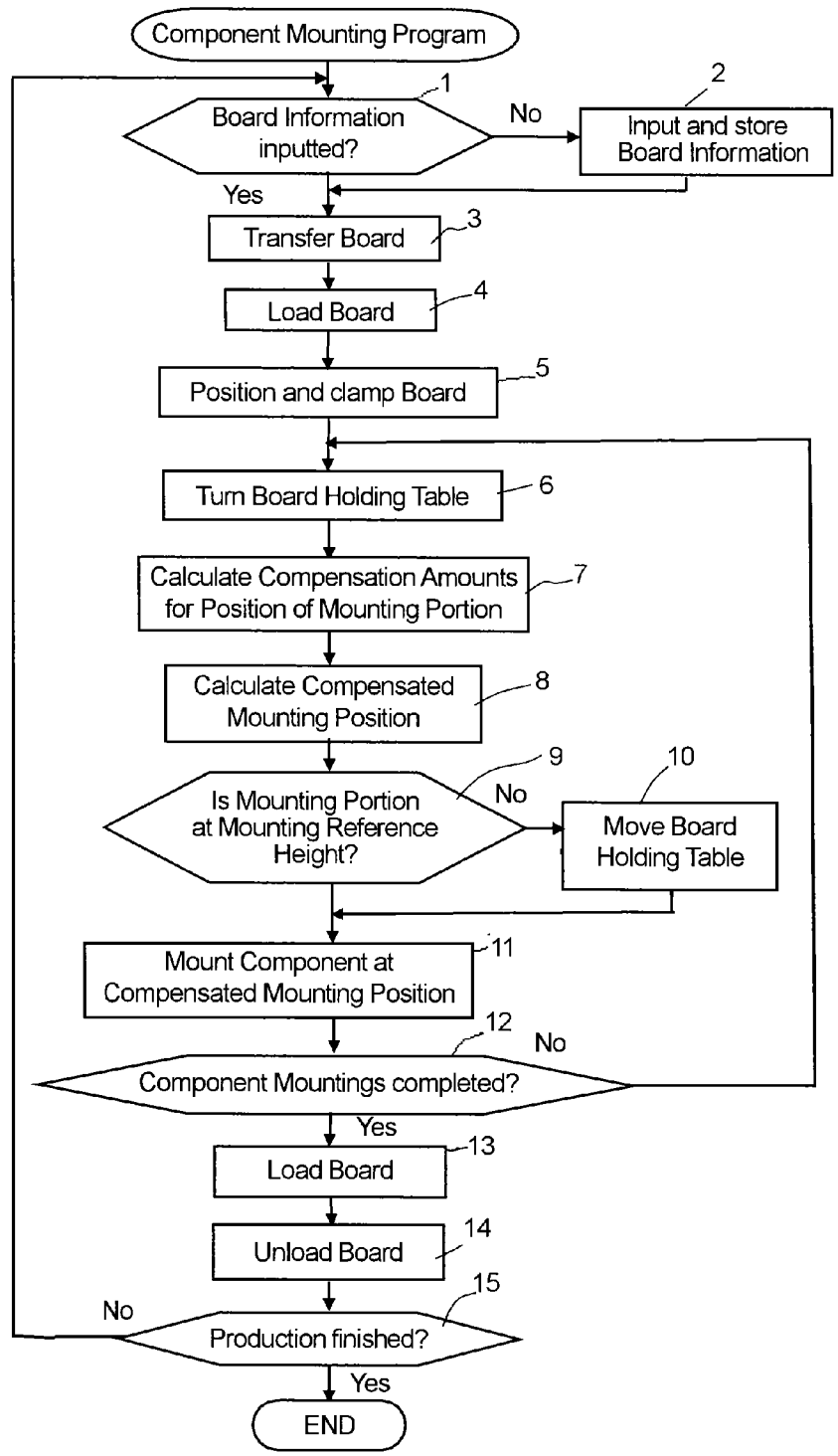
[FIG. 12] is a flow chart for explaining operations for component mountings by the component mounting apparatus in FIG. 1.

Next, a component mounting method by the aforementioned component mounting apparatus 1 will be described with reference to a flow chart shown in FIG. 12. It is supposed here that the position in the board holding device 2 of the turn shafts 222 for the board holding table 21, the positional relation between the turn shafts 222 and the board holding surface 21a and the information on the board holding device 2 comprising the holding positions 211x, 211Y of the board holding surface 21a have been measured in advance and have been stored in the control device 7. The control device 7 judges whether or not it has inputted the information on the board 11 comprising the position of the positioned portion 11b and the positions of mounting portions 11d (step 1), and if has not inputted, inputs the board information and stores the same in a memory of the control device 7 (step 2: corresponding to "board information inputting step" in the present invention).

The control device 7 controls the operation of the board transfer device 3 to load a board 11 to the vicinity of the board holding device 2 (step 3) and controls the operation of the board loading device 5 to load the board 11 from the board transfer device 3 onto the board holding device 2 (step 4). At this time, the board 11 is positioned with the positioned portion 11b held in contact with the positioning guide 211 of the board holding device 2. Then, the operation of the clamping member 212 in the board holding device 2 is controlled to clamp the clamped portion 11c of the board 11 (step 5: corresponding to "board loading and holding step" in the present invention).

The control device 7 controls the operation of the turn device 22 in the board holding device 2 based on the board holding device information and the board information stored in the memory to turn the board holding table 21 so that a normal line to a mounting portion 11d on the component mounting surface 11a of the board 11 is directed in the vertical direction (step 6: corresponding to "board turning step" in the present invention). Then, compensation amounts in the X, Y, Z-directions for the position of a mounting portion 11d are calculated based on the turn amount of the board holding table 21, the board information and the board holding device information, and a compensated mounting position of the mounting portion 11d is calculated from the calculated compensation amounts in the X, Y, Z-directions for the position of the mounting portion 11d and the board information (steps 7 and 8: corresponding to "compensated mounting position calculating step" in the present invention).

The control device 7 judges whether or not the mounting portion 11d is positioned at the mounting reference height (step 9), and if the mounting portion 11d is not positioned at the mounting reference height, controls the operation of the moving device 23 to move the board holding table 21 by a compensation amount in the Z-direction for the position of the mounting portion 11d in the Z-direction so that the mounting portion 11d is positioned at the mounting reference height (step 10). Thereafter, the operation of the component loading device 6 is controlled based on the compensated mounting position calculated for the mounting portion 11d to mount the component at the compensated mounting position of the mounting portion 11d (step 11: corresponding to "component mounting step" in the present invention). It can also be done to perform the component mounting by moving the component attraction nozzle 612 by the compensation amount in the Z-direction for the position of the mounting portion 11d in the Z-direction without moving the board holding table 21.

The control device 7 judges whether or not the component mountings on the present board 11 have been completed (step 12), and if the component mountings on the present board 11 have not been completed, executes the aforementioned steps after returning to step 6. On the other hand, if the component mountings on the present board 11 have been completed, the operation of the clamping member 212 in the board holding device 2 is controlled to unclamp the clamped portion 11c of the board 11. Thereafter, the operation of the board loading device 5 is controlled to load the board 11 from the board holding device 2 onto the board transfer device 3 (step 13), and the operation of the board transfer device 3 is controlled to unload the board 11 (step 14). The control device 7 judges whether or not the production of all of boards 11 has been finished (step 15), and if the production of all of boards 11 has not been finished, executes the aforementioned processing after returning to step 1. If the production of all of boards 11 has been finished, on the other hand, the component mounting program is finished.

Figure 13:
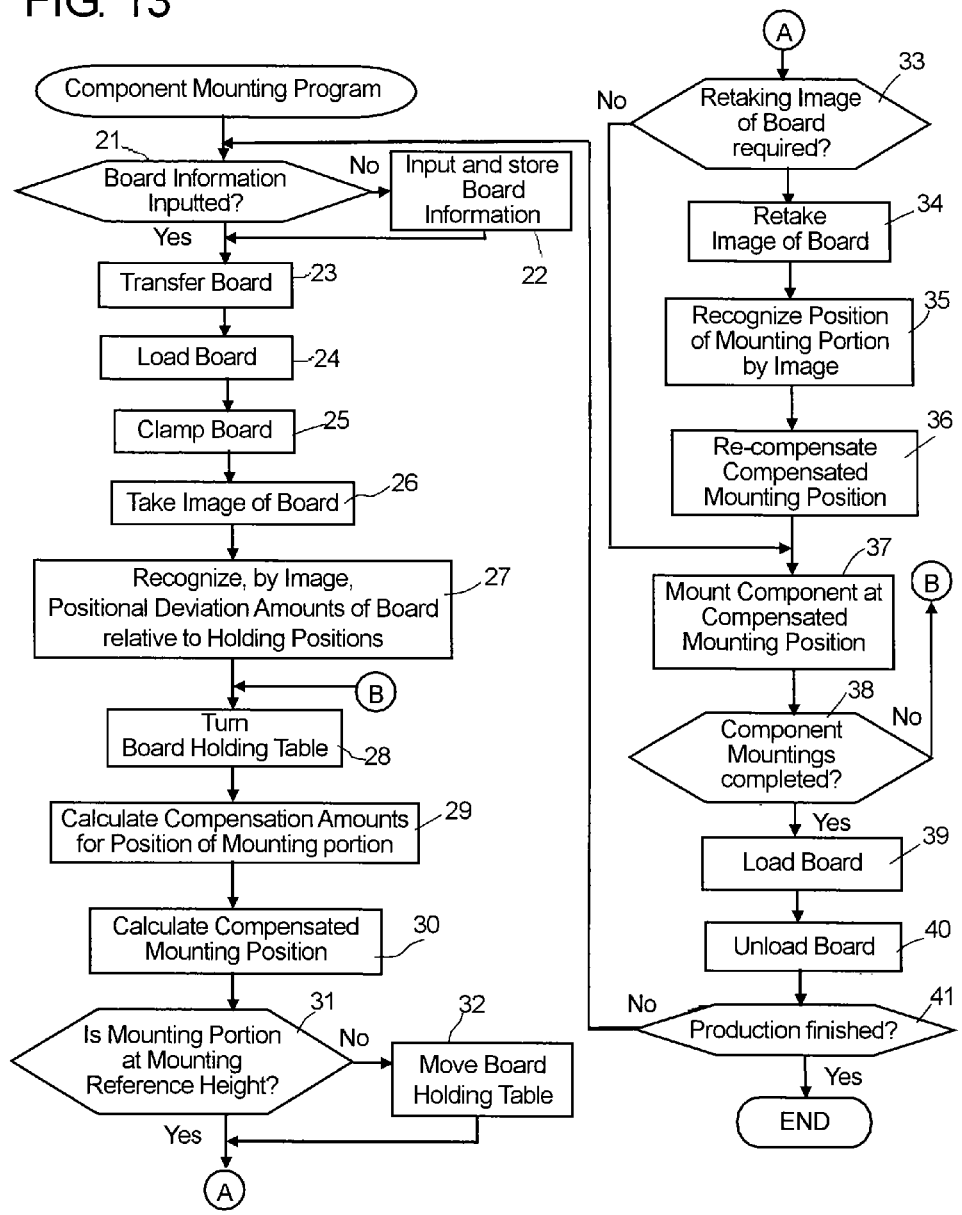
[FIG. 13] is a flow chart for explaining different operations for component mountings by the component mounting apparatus in FIG. 1.

The foregoing component mounting method is a method in which a component is mounted at each mounting portion 11*d* on the component mounting surface 11*a* of the board 11 with the positioned portion 11*b* of the board 11 held in contact with, and positioned by, the positioning guide 211 of the board holding device 2. As another component mounting method, there is a method in which a component is mounted at each mounting portion 11*d* on the component mounting surface 11*a* of the board 11 through the image recognition of the board 11 by the image pickup camera 55, and the method will be described with reference to a flow chart shown in FIG. 13. It is supposed here that the position in the board holding device 2 of the turn shafts 22 for the board holding table 21, the positional relation between the turn shafts 222 and the board holding surface 21*a*, and the information on the board holding device 2 comprising the holding positions 211*x*, 211Y of the board holding surface 21*a* have been measured in advance and have been stored in the memory of the control device 7.

The control device 7 judges whether or not it has inputted the information on a board 11 comprising the position of the positioned portion 11*b* and the positions of mounting portions 11*d* (step 21), and if having not inputted, inputs the board information to store the same in the memory of the control device 7 (step 22: corresponding to "board information inputting step" in the present invention). Then, the operation of the board transfer device 3 is controlled to load the board 11 to the vicinity of the board holding device 2 (step 23), and the operation of the board loading device 5 is controlled to load the board 11 from the board transfer device 3 onto the board holding device 2 (step 24). In this case, the accuracy suffices to be rough when the positioned portion 11*b* of the board 11 is brought into contact with, and is positioned by, the positioning guide 211 of the board holding device 2. Thereafter, the operation of the clamping member 212 in the board holding device 2 is controlled to clamp the clamped portion 11*c* of the board 11 (step 25: corresponding to "board loading and holding step" in the present invention).

The control device 7 controls the operations of the board loading device 5 and the board image pickup camera 55 to take the image of the board 11 (step 26) and recognizes, by image, positional deviation amounts of the board 11 relative to the holding positions 211*x*, 211Y (step 27: corresponding to "board position recognizing step" in the present invention). Then, the control device 7 controls the operation of the turn device 22 in the board holding device 2 based on the board holding device information and the board information stored in the memory to turn the board holding table 21 so that a normal line to each mounting portion 11*d* on the component mounting surface 11*a* of the board 11 is directed in the vertical direction (step 28: corresponding to "board turning step" in the present invention).

The control device 7 calculates the compensation amounts in the X, Y, Z-directions for the position of the mounting portion 11*d* based on the positional deviation amounts of the board 11 relative to the holding positions 211*x*, 211Y, the turn amount of the board holding table 21, the board information and the board holding device information and calculates a compensated mounting position of the mounting portion 11*d* from the compensation amounts in the X, Y, Z-directions for the position of the calculated mounting portion 11*d* and the board information (steps 29 and 30: corresponding to "compensated mounting position calculating step" in the present invention). Thereafter, a judgment is made of whether or not the mounting portion 11*d* is positioned at the mounting reference height (step 31), and if the mounting portion 11*d* is not positioned at the mounting reference height, the operation of the moving device 23 is controlled to move the board holding table 21 by a compensation amount in the Z-direction for the position of the mounting portion 11*d* in the Z-direction so that the mounting portion 11*d* is positioned at the mounting reference height (step 32).

In the case that a compensated mounting position of the mounting portion 11*d* is required to be raised in accuracy as is the case that, for example, there is a hole at a mounting portion 11*d* on the component mounting surface 11*a* of the board 11 and thus there is likely a situation that the position in the horizontal direction of the center of the hole is altered by the turn of the board 11, it may be done to retake the image of the board 11 and to recognize by image the position of the mounting portion 11*d* after the turn. Therefore, the control device 7 judges whether or not the image of the board 11 is to be retaken (step 33), and proceeds to step 37 if the image of the board 11 is unnecessary to be retaken.

On the other hand, when the image of the board 11 is necessary to be retaken, the control device 7 controls the operations of the board loading device 5 and the board image pickup camera 55 to retake the image of the board 11 (step 34) and recognizes by image the position of the mounting portion 11*d* after the turn (step 35: corresponding to "post-turn mounting position recognizing step" in the present invention). Then, the compensated mounting position of the mounting portion 11*d* is re-compensated by the difference between the position of the mounting portion 11*d* on the board 11 recognized by image and the compensated mounting position calculated for the mounting portion 11*d* (step 36: corresponding to "board re-compensated position calculating step" in the present invention). Thereafter, the operation of the component loading device 6 is controlled based on the compensated mounting position calculated for the mounting portion 11*d* or the compensated mounting position having been re-compensated, to mount the component at the compensated mounting position of the mounting portion 11*d* (step 37: corresponding to "component mounting step" in the present invention).

The control device 7 judges whether or not the component mountings on the present board 11 have been completed (step 38), and if the component mountings on the present board 11 have not been completed, executes the aforementioned processing after returning to step 28. On the other hand, if the component mountings on the present board 11 have been completed, the control device 7 controls the operation of the clamping member 212 in the board holding device 2 to unclamp the clamped portion 11*c* of the board 11. Then, the operation of the board loading device 5 is controlled to load the board 11 from the board holding device 2 onto the board transfer device 3 (step 39), and the operation of the board transfer device 3 is controlled to unload the board 11 (step 40). The control device 7 judges whether or not the production of all of the boards 11 has been finished (step 41), and if the production of all of the boards 11 has not been finished, executes the aforementioned processing after returning to step 21. On the other hand, if the production of all of the boards 11 has been finished, the component mounting program is finished.

INDUSTRIAL APPLICABILITY

The present invention is applicable to the case that components are mounted on a board having a non-planar component mounting surface such as curved surface, slant surface or the like.

DESCRIPTION OF SYMBOLS 1, 8 . . . component mounting apparatus, 2, 9 . . . board holding device, 3 . . . board transfer device, 4 . . . component supply device, 5 . . . board loading device, 6 . . . component loading device, 7 . . . control device, 11, 12, 13 . . . board, 11a, 12a, 13a . . . component mounting surface, 21, 91 . . . board holding table, 22 . . . turn device, 23 . . . moving device, 92 . . . second turn device, 93 . . . positioning device

The invention claimed is:

1. A component mounting method in a component mounting apparatus comprising:
a board holding device having a holding member that, in order to mount a component on a board having a non-planar component mounting surface, holds the board at a holding position on a board holding surface and turns the board;
a board transfer device that loads and unloads the board with respect to the board holding surface of the holding member;
a component supply device that supplies the component to be mounted on the board; and
a component loading device that picks up the component from the component supply device and moves the component in two orthogonal directions within a horizontal plane and in a vertical direction to mount the component at a mounting portion on the board held at the holding position on the board holding surface;
the component mounting method comprising:
a board information inputting step of inputting board information relating to the position of a positioned portion for positioning the board on the board holding surface and the position of the mounting portion;
a board loading and holding step of loading the board to the holding position on the board holding surface by the board transfer device and of holding the loaded board at the holding position on the board holding surface by holding means provided in the board holding device;
a board turning step of turning the holding member of the board holding device so that a normal line to the mounting portion on the non-planar component mounting surface is directed in the vertical direction, based on board holding device information stored in advance that relates to the position in the board holding device of a turn shaft for the holding member, a positional relation between the turn shaft and the board holding surface and the position of the holding position on the board holding surface, and the inputted board information;
a compensated mounting position calculating step of calculating compensation amounts in the two orthogonal directions within the horizontal plane and the vertical direction for the position of the mounting portion whose normal line is directed in the vertical direction at the board turning step, based on a turn amount of the holding member at the board turning step, the board holding device information and the board information and of calculating a compensated mounting position from the compensation amounts in the two orthogonal directions within the horizontal plane and in the vertical direction and the board information; and
a component mounting step of mounting the component at the mounting portion on the board based on the compensated mounting position.

2. The component mounting method in claim 1, wherein:
the board holding device is constructed movably in the vertical direction; and
the component mounting step includes compensatingly moving the board holding device in the vertical direction with respect to the compensation amount in the vertical direction calculated at the compensated mounting position calculating step.

3. The component mounting method in claim 1, comprising:
a board position recognizing step of taking, by an image pickup device, an image of the board held at the holding position on the board holding surface and of recognizing, by image, positional deviation amounts of the board relative to the holding position;
wherein the compensated mounting position calculating step includes calculating the compensation amounts in the two orthogonal directions within the horizontal plane and in the vertical direction for the position of the mounting portion whose normal line is directed in the vertical direction at the board turning step, based on the positional deviation amounts, a turn amount of the holding member at the board turning step, the board holding device information and the board information.

4. The component mounting method in claim 1, comprising:
a post-turn mounting position recognizing step of taking an image of the mounting portion by the image pickup device after the holding member is turned to direct the normal line to the position of the mounting portion in the vertical direction at the board turning step, and of recognizing, by image, the position of the mounting portion after the turn; and
a board re-compensated position calculating step of re-compensating the compensated mounting position by the difference between the position of the post-turn mounting portion recognized by image and the compensated mounting position calculated at the compensated mounting position calculating step; and
wherein the component mounting step includes mounting the component at the mounting portion on the board based on the compensated mounting position having been re-compensated.

5. A component mounting apparatus comprising:
a board holding device having a holding member that, in order to mount a component on a board having a non-planar component mounting surface, holds the board at a holding position on a board holding surface and turns the board;
a board transfer device that loads and unloads the board with respect to the board holding surface of the holding member;
a component supply device that supplies the component to be mounted on the board;
a component loading device that picks up the component from the component supply device and moves the component in two orthogonal directions within a horizontal plane and in a vertical direction to mount the component at a mounting portion on the board held at the holding position on the board holding surface; and
a control device that controls operations of the board holding device, the board transfer device, the component supply device and the component loading device;

wherein the control device comprises:

input means for inputting board information that relates to the position of a positioned portion for positioning the board on the board holding surface and the position of the mounting portion, and board holding device information that relates to the position in the board holding device of a turn shaft for the holding member, a positional relation between the turn shaft and the board holding surface and the position of the holding position on the board holding surface;

memory means for storing the board information and the board holding device information inputted;

board loading and holding means for loading the board to the holding position on the board holding surface by the board transfer device and for holding the loaded board at the holding position on the board holding surface by holding means provided in the board holding device;

board turning means for turning the holding member of the board holding device so that a normal line to the mounting portion on the non-planar component mounting surface is directed in the vertical direction, based on the board information and the board holding device information;

compensated mounting position calculating means for calculating compensation amounts in the two orthogonal directions within the horizontal plane and in the vertical direction for the position of the mounting portion whose normal line is directed in the vertical direction by the board turning means, based on a turn amount of the holding member by the board turning means, the board holding device information and the board information and for calculating a compensated mounting position from the compensation amounts in the two orthogonal directions within the horizontal plane and in the vertical direction and the board information; and component mounting means for mounting the component at the mounting portion on the board based on the compensated mounting position.

6. The component mounting method in claim 5, wherein:
the board holding device is constructed movably in the vertical direction; and
the component mounting means compensatingly moves the board holding device in the vertical direction with respect to the compensation amount in the vertical direction calculated by the compensated mounting position calculating means.

7. The component mounting apparatus in claim 5, comprising:
an image pickup device being able to take an image of the board;
wherein the control device is provided with:
board position recognizing means for taking an image of the board held at the holding position on the board holding surface, by the image pickup device and for recognizing by image the positional deviation amounts of the board relative to the holding position; and
wherein the compensated mounting position calculating means calculates compensation amounts in the two orthogonal directions within the horizontal plane and in the vertical direction for the position of the mounting portion whose normal line is directed in the vertical direction by the board turning means, based on the positional deviation amounts, the turn amount of the holding member by the board turning means, the board holding device information and the board information.

8. The component mounting apparatus in claim 5, wherein:
the holding member is composed of a first holding member that has a first turn shaft being able to turn about a horizontal axis, and a second holding member that has a second turn shaft being turnable about an axis orthogonal to the first turn shaft on the first holding member; and
the board turning means individually turns the first holding member and the second holding member in the board holding device so that a normal line to the mounting portion on the non-planar component mounting surface is directed in the vertical direction, based on the board information and the board holding device information.

* * * * *